US009252080B1

(12) United States Patent
Couture et al.

(10) Patent No.: US 9,252,080 B1
(45) Date of Patent: Feb. 2, 2016

(54) DIELECTRIC COVER FOR A THROUGH SILICON VIA

(71) Applicant: GLOBALFOUNDRIES INC., Grand Cayman, KY (US)

(72) Inventors: Daniel J. Couture, Jericho, VT (US); Jeffrey P. Gambino, Westford, VT (US); Zhong-Xiang He, Essex Junction, VT (US); Anthony K. Stamper, Williston, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/514,640

(22) Filed: Oct. 15, 2014

(51) Int. Cl.
*H01L 21/24* (2006.01)
*H01L 23/48* (2006.01)
*H01L 21/768* (2006.01)
*H01L 21/321* (2006.01)

(52) U.S. Cl.
CPC .......... *H01L 23/481* (2013.01); *H01L 21/3212* (2013.01); *H01L 21/7684* (2013.01); *H01L 21/76802* (2013.01); *H01L 21/76843* (2013.01); *H01L 21/76877* (2013.01); *H01L 21/76898* (2013.01)

(58) Field of Classification Search
CPC .................. H01L 21/76834; H01L 21/76819; H01L 21/02065; H01L 21/76805; H01L 21/76898; H01L 23/5226; H01L 21/76802; H01L 23/481
USPC ................................ 438/624, 639, 640, 637
See application file for complete search history.

(56) References Cited

U.S. PATENT DOCUMENTS 5,977,599 A 11/1999 Adrian
6,228,763 B1 * 5/2001 Lee ..................... H01L 21/7682
257/E21.581
RE39,690 E * 6/2007 Kalnitsky .......... H01L 21/02126
257/634
2010/0032809 A1 2/2010 Collins et al.
2012/0137515 A1* 6/2012 Lindgren .......... H01L 21/76838
29/852
2012/0280395 A1 11/2012 Farooq et al.
2013/0065393 A1 3/2013 Gambino et al.
2013/0171772 A1 7/2013 Lin et al.

(Continued)

OTHER PUBLICATIONS

Bauer et al., "Front End of Line Integration of High Density, Electrically Isolated, Metallized Through Silicon Vias", IEEE 59th Electronic Components and Technology Conference (ECTC 2009), pp. 1165-1169 (2009).

(Continued)

*Primary Examiner* — Long K Tran
(74) *Attorney, Agent, or Firm* — David Cain; Hoffman Warnick LLC

(57) ABSTRACT

An approach to creating a semiconductor structure for a dielectric layer over a void area includes determining a location of a void area of the topographical semiconductor feature. A second dielectric layer is deposited on a first dielectric layer and a top surface of a topographical semiconductor feature. The second dielectric layer is patterned to one or more portions, wherein at least one portion of the patterned second dielectric layer is over the location of the void area of the topographical semiconductor feature. A first metal layer is deposited over the second dielectric layer, at least one portion of the first dielectric layer, and a portion of the top surface of the topographical semiconductor feature. A chemical mechanical polish of the first metal layer is performed, wherein the chemical mechanical polish reaches the top surface of at least one of the one or more portions of the second dielectric layer.

11 Claims, 4 Drawing Sheets

(56) References Cited

U.S. PATENT DOCUMENTS

2014/0008757 A1    1/2014  Ramachandran et al.
2015/0061147 A1*   3/2015  Lin .................. H01L 23/53238
                                                        257/774

OTHER PUBLICATIONS

Kikuchi et al., "Tungsten Through-Silicon Via Technology for Three-Dimensional LSIs", Japanese Journal of Applied Physics, vol. 47, No. 4, pp. 2801-2806 (2008).

Stamper et al., "CMOS Compatible Insulated Through Silicon Vias for 3D Silicon", Proc. 2009 Advanced Metallization Conference (AMC 2009), published by Materials Research Society, 12 pages (2009).

Stamper et al., "Through Wafer Via Integration in CMOS and BiCMOS Technologies", Proc. 2008 Advanced Metallization Conference (AMC 2008), published by Materials Research Society, pp. 495-500, (2009).

Triyoso et al., "Progress and Challenges of Tungsten-Filled Through-Silicon Via", 2010 IEEE International Conference on IC Design and Technology (ICICDT), pp. 118-121 (2010).

\* cited by examiner

DIELECTRIC COVER FOR A THROUGH SILICON VIA

BACKGROUND OF THE INVENTION

The present invention relates generally to the field of semiconductor technology, and more particularly to through silicon via formation in semiconductor manufacture.

There continues to be a demand for more densely formed integrated circuits on semiconductor chips. One approach has been to reduce the physical scale of the circuit components so more circuits can be formed laterally on a semiconductor chip. Another approach is to vertically form devices on a semiconductor chip such as a vertical field effect transistor (VFET) or a three dimensional device structure such as a finFET. Silicon on insulator (SOI) structures provide another opportunity for vertical integration of semiconductor devices. A SOI structure for a SOI wafer has an insulating layer that may be grown in a semiconductor wafer or alternatively, a SOI wafer is composed of two semiconductor wafers bonded together, one of which has an insulating layer on a wafer top surface. The insulating layer on the top surface of the one wafer is sandwiched between the two semiconductor wafers when bonded. While another approach for vertical integration is to integrate two or more chips, each having semiconductor devices and interconnect wiring using three dimensional (3D) chip to chip stacking technology. Some of the advantages provided by 3D stacking include enabling a greater density of integrated circuits, enhanced performance, and improved form factors. There are a number of applications for 3D stacking including high performance devices, video and graphics processors, and high density, high bandwidth memory chips.

3D structures and silicon on insulator (SOI) structures employ through silicon vias (TSV) to provide electrical connections between the semiconductor devices and to the interconnect wiring formed on the multiple semiconductor wafer or chip layers. Preferably, a TSV has high conductivity and uses high conductivity materials such as copper, tungsten and less commonly, polysilicon to fill vias. Since TSV by definition extends through the semiconductor wafer, a TSV length is approximately the thickness of the semiconductor chip or wafer, which can be orders of magnitude more than a typical back end of line (BEOL) interconnect via length connecting only a few BEOL interconnect layers of a semiconductor wafer. Typically, TSVs extend from a metal-line level wiring layer in the BEOL interconnect to a bottom surface of the semiconductor chip.

SUMMARY

Embodiments of the present invention provide a method for forming a dielectric layer over a void area of a topographical semiconductor feature and a semiconductor structure for a dielectric layer over a void area. The method includes determining a location of a void area of the topographical semiconductor feature and depositing, on a first dielectric layer and a top surface of a topographical semiconductor feature, a second dielectric layer. Furthermore, the method includes patterning one or more portions of the second dielectric layer, wherein at least one portion of the patterned second dielectric layer is over the location of the void area of the topographical semiconductor feature. Additionally, the method includes depositing a first metal layer over the second dielectric layer, at least one portion of the first dielectric layer, and a portion of the top surface of the topographical semiconductor feature. Finally, the method includes performing a chemical mechanical polish of the first metal layer, wherein the chemical mechanical polish reaches the top surface of at least one of the one or more portions of the second dielectric layer.

The semiconductor structure includes a first dielectric layer covering a barrier layer and adjacent to a topographical semiconductor feature, wherein the topographical semiconductor feature has a void area. Additionally, the semiconductor structure includes a patterned second dielectric layer covering the void area of the topographical semiconductor feature and at least one portion of the first dielectric layer. A first metal layer covers a portion of the topographical semiconductor feature, a portion of the patterned second dielectric layer covering the void area of the topographical semiconductor feature, a portion of the first dielectric layer and the patterned second dielectric layer covering the at least one portion of the first dielectric layer.

DETAILED DESCRIPTION

Figure 1:
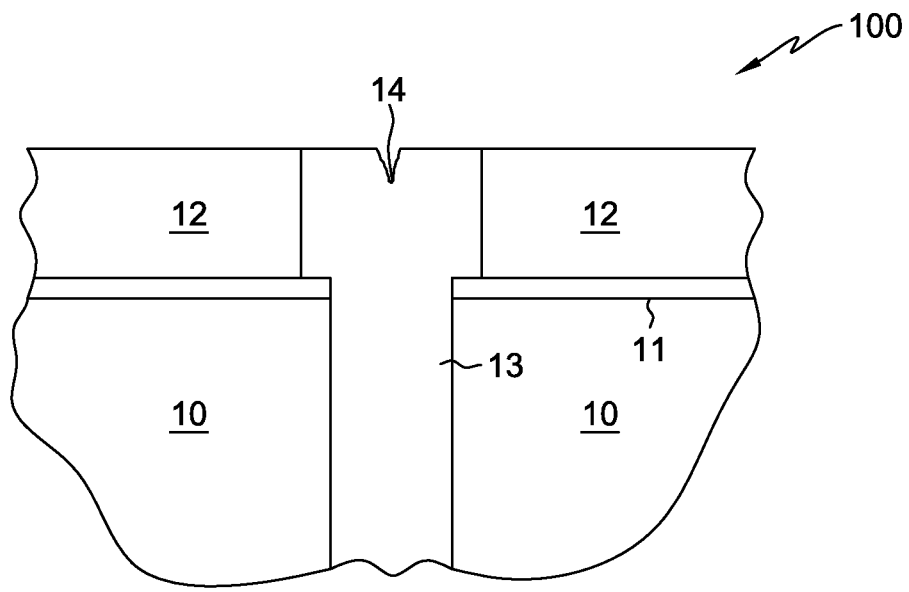
FIG. 1 depicts a cross-sectional view of a wafer after forming and filling TSV, in accordance with an embodiment of the present invention.

Detailed embodiments of the claimed structures and methods are disclosed herein. The method steps described below do not form a complete process flow for manufacturing integrated circuits. The present embodiments can be practiced in conjunction with the integrated circuit fabrication techniques currently used in the art, and only so much of the commonly practiced process steps are included as are necessary for an understanding of the described embodiments. The figures represent cross-section portions of a semiconductor chip or a substrate during fabrication and are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

References in the specification to "one embodiment", "other embodiment", "another embodiment", "an embodiment", etc., indicate that the embodiment described may include a particular feature, structure or characteristic, but every embodiment may not necessarily include the particular feature, structure or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "over", "on", "positioned on" or "positioned atop" mean that a first element is present on a second element wherein intervening elements, such as an interface structure, may be present between the first element and the second element. The term "direct contact" means that a first element and a second element are connected without any intermediary conducting, insulating or semiconductor layers at the interface of the two elements.

In the interest of not obscuring the presentation of the embodiments of the present invention, in the following detailed description, some of the processing steps or operations that are known in the art may have been combined together for presentation and for illustration purposes and in some instances may not have been described in detail. In other instances, some processing steps or operations that are known may not be described. It should be understood that the following description is rather focused on the distinctive features or elements of the various embodiments of the present invention.

Through silicon vias (TSV) may be used in semiconductor chips to transport power and signals from one side of a semiconductor chip to the other side of the semiconductor chip. TSV may be called through substrate vias when other semiconductor materials beyond silicon are employed for the semiconductor wafer or substrate. TSV extending from a metal level wiring layer to the bottom surface of a semiconductor chip may be used in conjunction with an array of solder balls, such as controlled collapse chip connection (C4) solder balls utilized in one method of 3D chip stacking. In some cases, an array of TSV may be used to provide multiple connections to a metal pad in a semiconductor chip to minimize resistance and to maximize yield and reliability in semiconductor wafer processing of semiconductor chips or SOI wafers.

Commonly extending from a metal level wiring layer within the BEOL interconnect structure to the bottom of the semiconductor wafer, a TSV may have high aspect ratio vias. A via aspect ratio is a depth of a via, divided by a diameter of the via. TSV with high aspect ratios include challenges in via fill processes which may limit the use of metallization processes such as sputtering or evaporation. Embodiments of the present invention recognize that the challenges in TSV via hole fill, particularly, within vias filled with tungsten based materials using chemical vapor deposition (CVD) and low pressure chemical vapor deposition (LPCVD), exist where a metal deposited on the sides of a via hole may not completely fill the via hole. The incomplete via hole fill may form a void or a seam in the center of the via which, later in semiconductor processing, can evolve into a defect or create higher current density in the interconnection leading to electromigration fails in the field.

Embodiments of the present invention recognize that a void or a seam in a TSV surface may trap a solution from a wet process such as metal plating used in the semiconductor device formation. When the trapped solutions are exposed to high temperatures in later semiconductor processes they may explosively vaporize or rapidly expand creating defects in the TSV and the metal layers connecting the TSV to other interconnect wiring. In particular, the seam or void may trap a copper plating solution when the first metal layer (M1) is plated. The trapped plating solution may rapidly vaporize or explode during the first hot process creating large defects or holes within the semiconductor structures which may cause reliability issues in the finished semiconductor chip. Residual chemicals trapped in the void may also create reliability or electromigration issues for the semiconductor chip.

Embodiments of the present invention provide a structure and method to prevent trapping of a solution in a seam or void created at via fill in a TSV. A dielectric cover may be formed over the seam or a void area created at via fill in the TSV. The dielectric cover prevents entry of metal plating solutions into the seam or void area. The dielectric cover prevents the entry of wet semiconductor processing solutions and the subsequent entrapment of the solutions in the seam or void area. The dielectric cover provides an opportunity for a reduction in TSV and metal layer connection defects, and therefore, may improve yield and reliability for semiconductor wafers and chips. While the embodiments of the present invention discuss in detail forming a dielectric cover or plug over a void area in a TSV, the scope of this invention should not be limited only to TSV structures. The dielectric cover or plug is intended to be used over any topographical feature of a semiconductor wafer that occurs during wafer fabrication, in which, the potential presence of a void is predictable and may be predetermined. A dielectric cover may be used to prevent entry of contaminates or wet solutions in a topographical semiconductor feature or area where repeatable or predictable voids, holes or low areas occur, trapping contaminates which cause potential yield or reliability concerns. The topographical semiconductor features with predictable areas of voids include other metal semiconductor circuit features or dielectric semiconductor features. For example, a polysilicon-filled deep trench capacitor may utilize a dielectric cover over a void area in the center of the trench created due to poor polysilicon trench fill.

Additionally, embodiments of the present invention use an array of dielectric material filled holes created during dielectric cover formation to provide stress relief for a M1 pad connecting an array of TSV. The holes, formed from a portion of the dielectric layer deposited in creating the dielectric cover, may provide stress relief to the M1 pad. Stresses may occur in the M1 pad when an array of TSV are connected to the M1 metal pad. The stress in the metal pad such as a copper pad arises, in part, from the differing co-efficient of expansion of the various materials (e.g. copper, tungsten, and multiple dielectric materials such as SiO2 and borophosphate silicate glass) used in the TSVs. TSV structures with the various materials connect in multiple contact areas for the array of TSV in the M1 pad causing stress in the M1 pad. In an embodiment of the present invention, an array of dielectric material filled holes in the M1 pad connecting an array of TSV provides stress relief for the M1 pad.

FIG. 1 depicts a cross-sectional view of wafer 100 after forming and filling TSV, in accordance with an embodiment of the present invention. As depicted, FIG. 1 includes semiconductor substrate 10, barrier layer 11, first dielectric layer 12, TSV 13, and TSV void 14 in the TSV. TSV 13 may be formed after front end of the line processing such as semiconductor device (not shown) formation. Semiconductor device formation, for example, includes the formation of bipolar semiconductor devices, complementary metal-oxide semiconductor devices (CMOS), passive devices, or other semiconductor devices. Wafer 100 depicts a void, TSV void 14, which may be a seam formed in the center or center area of a TSV via such as TSV 13 due to an incomplete metal fill of the TSV via.

Semiconductor substrate 10 may be composed of a semiconductor material such as silicon and formed by conventional semiconductor substrate processing. In an embodiment, semiconductor substrate 10 may be a layered semiconductor substrate such as a silicon-on-insulator substrate (SOI) which may be composed of silicon or another semiconductor material such as SiGe. Semiconductor substrate 10 may be created from any suitable semiconductor material including but, not limited to: Si, SiGe, SiGeC, GaAs, Ga, InAs or other semiconductor material which may be single crystalline, polycrystalline, amorphous, strained or an unstrained in structure. Barrier layer 11, residing on semiconductor substrate 10, may be an electrically insulating layer which may also act as a chemical barrier layer. Barrier layer 11, deposited by known deposition processes, may be composed of silicon nitride (SiN), compounds of SiN, TiN, or any other suitable insulating material used in semiconductor wafer manufacture.

First dielectric layer 12 may be a first intermetallic layer made of an insulating dielectric material deposited on semiconductor substrate 10 over barrier layer 11. An intermetallic layer may be used for an insulating layer between conducting layers in semiconductor fabrication. First dielectric layer 12 is composed of borophosphosilicate glass (BPSG) in the exemplary embodiment but, may be composed of any other suitable dielectric material in other embodiments. BPSG may be deposited using known processes such as chemical vapor deposition (CVD).

TSV 13 may be formed using known through silicon via processes. For example, TSV 13 may be formed by a via hole formation or a via etch using a selective, deep silicon reactive ion etch. A deep silicon reactive ion etch chamber may be used to etch vias for TSV formation. Etching the vias may be a one, a two or a multi-step process depending on the depth required for the TSV and the materials used. TSV 13 may be insulated by chemical vapor deposition (CVD) of a suitable nitride and/or sub-atomic CVD of a suitable oxide. In an embodiment, TSV 13 may be uninsulated. In an embodiment, TSV 13 may be seeded by a physical vapor deposition (PVD) tool with tantalum (Ta) or copper (Cu), for example, and the via filled with a metal such as copper or tungsten (W) in a TSV plating chamber. However, TSV seed and via metal fill may be accomplished with other metal or metal alloys and suitable deposition processes in another embodiment. In some embodiments, another metal layer, for example, titanium nitride, may deposited between the titanium seed layer and via metal fill metal (Cu or W). TSV 13 may be used to electrically connect contacts on semiconductor devices, connect wiring on various levels of a semiconductor device or wafer or to connect device contacts to interconnect wiring including back end of the line (BEOL) interconnect wiring. In the exemplary embodiment, TSV 13 are bars. In an embodiment, the bar shaped TSV 13 may have top via dimensions such as three to ten μm wide by approximately forty to seventy μm long with a depth of fifty to two hundred μm. In other embodiments, TSV 13 may have bar shaped TSV with other lengths, width, and depths. For example, TSV 13 may be 15 μm wide, 30 μm long with a depth of 225 μm. Additionally, in another embodiment, TSV 13 may have another shape. For example, TSV 13 may be a circle (i.e. a cylinder), a square (i.e. a square post), an ellipse (i.e. an elliptical cylinder), or other appropriate geometric shape.

TSV void 14 may occur in TSV 13 in the center area of the outer surfaces or ends of the via or TSV 13. TSV void 14 occurs when the etched vias are incompletely filled during metal via fill. For example, copper or tungsten deposited during TSV via plating in a TSV plating chamber or other metal deposition process adheres to the edges of the via but, does not completely fill the via, forming a void, a series of voids, a seam or a void area in the center of the TSV 13. The voids, such as TSV void 14, may occur during metal via fill in the TSV plating chamber when via ends are not completely filled. The voids which may be singular voids in the center or a void area of the via, a series of voids forming a crack, a seam or a ravine-like structure in the void area of the rectangular shaped bar TSV 13 present after CMP. For a bar TSV such as TSV 13, the void area is in the center of TSV 13, however in other embodiments, TSV 13 with different shapes may have a non-central void area created during via metal fill.

Figure 2:
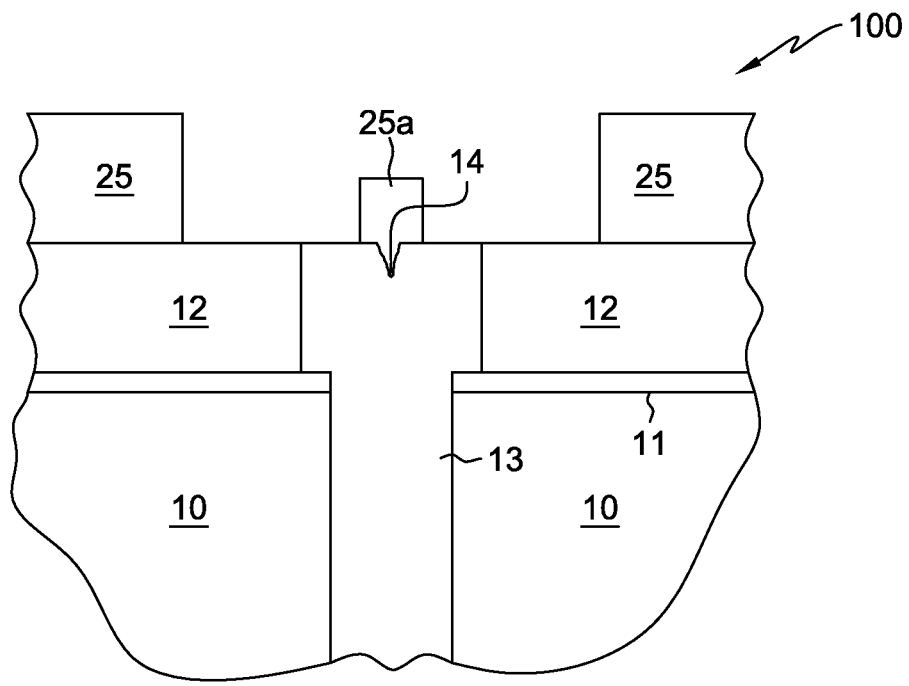
FIG. 2 depicts a cross-sectional view of the wafer after depositing and patterning a dielectric layer, in accordance with an embodiment of the present invention.

FIG. 2 depicts a cross-sectional view of wafer 100 after depositing and patterning a dielectric layer, in accordance with an embodiment of the present invention. As depicted, FIG. 2 includes the elements of FIG. 1 and a second dielectric layer, dielectric layer 25. Dielectric layer 25 is deposited on first dielectric layer 12 and on the top surface of TSV 13. In the exemplary embodiment, the second dielectric material, dielectric layer 25, is composed of silicon dioxide. Dielectric layer 25 may also be composed of other suitable dielectric materials such as BPSG, polysilicon glass, SiN, SiCOH or similar dielectric materials in other embodiments.

In the exemplary embodiment, dielectric layer 25 is patterned to form the second dielectric layer with two different heights or thicknesses. The two different height layers of dielectric layer 25 are depicted as dielectric layer 25a and dielectric layer 25 where dielectric layer 25a is thinner than dielectric layer 25 and has a lower height than dielectric layer 25. Dielectric layer 25a resides over TSV void 14 and acts as a dielectric cover or plug. Dielectric layer 25a covers or plugs TSV void 14 from wet process solutions such as metal plating solutions used in forming metal contacts on TSV 13. In the exemplary embodiment, dielectric layer 25a is patterned to form a rectangular shaped dielectric cover or plug. In another embodiment, dielectric layer 25a may be patterned to form any geometric shape needed to cover the void area of the TSV (e.g. TSV void 14). The two different heights of dielectric layer 25 may be achieved in one or several known processes however, the different heights may be achieved by other processes in another embodiment. In the exemplary embodiment, dielectric layer 25a (e.g. the dielectric cover) is one μm to four μm wide. In other embodiments, dielectric layer 25a may have any width and length required to cover the void area of the TSV. In other embodiments, the dielectric cover or dielectric layer such as dielectric layer 25a may be placed over any topographical semiconductor feature with a predictable void area.

In an embodiment, dielectric layer 25 may be a sensitized polyimide exposed to an ultraviolet light source through a halftone mask. As known to one skilled in the art, exposing a sensitized polyimide to an ultraviolet light source through a halftone mask allows for a partial removal of the dielectric layer (i.e. polyimide) in the halftone mask areas. An area selectively exposed with a halftone mask may result in a thinner second dielectric layer in halftone mask areas. Dielectric layer 25a depicts two areas where a halftone mask is utilized creating a thinner layer of the dielectric, dielectric layer 25a, over TSV void 14 as depicted in FIG. 2.

Similarly, in another embodiment, a positive type resist may be used with a half tone mask on dielectric layer 25 to form two different heights for the dielectric layer 25, as depicted in FIG. 2. A positive type resist dissolves in an exposed area and remains in unexposed areas. As known to one skilled in the art, a halftone mask may create resist patterns with two different thicknesses used to create the dielectric layer thicknesses depicted in FIG. 2 after etch. An exposed area of the resist may create dielectric layer 25, a partially exposed resist area may create dielectric layer 25a and a unexposed area of resist removes the portion of dielectric layer 25 where no resist is present during etch in an embodiment. Dielectric layer 25a over the TSV void area (e.g. TSV void 14) may be formed using a halftone mask and suitable etch processes.

In another embodiment of the present invention, a multiple dielectric deposit and etch process as may be done with a dual damascene process known to one skilled in the art, forms the two thicknesses of the dielectric layer as depicted in FIG. 2. A first layer of dielectric material may be deposited, patterned using lithography, and etched to form dielectric layer 25a. After resist strip, a second dielectric layer may be deposited, patterned using lithography, and etched to form the dielectric layer with the thickness or height depicted in dielectric layer 25. In one embodiment, dielectric layer 25a and dielectric layer 25 may by composed of different dielectric materials.

In the exemplary embodiment, the portion of the dielectric material, dielectric layer 25a is over the center area or void area, TSV void 14 of TSV 13 to cover or plug any voids due to incomplete metal fill of the via forming TSV 13. In one embodiment, the location of the void area is determined based on empirical data. Empirical data such as TSV via cross-sections and cross-sections of M1 defects in the TSV area may be collected to determine the location of the void area. In another embodiment, the circuit designer or semiconductor process engineer may determine the TSV void area. The location of TSV void 14 is depicted in the center of TSV 13 however, in some embodiments, the location of TSV void 14 may be a different location and the patterned area of the dielectric cover, dielectric layer 25a over the TSV void 14 may be moved accordingly to cover the TSV voids that are in a non-centered location. The shape of the area of the patterned dielectric layer 25a over TSV void 14 may be TSV design dependent. For example, a rectangular shaped TSV (i.e. a bar TSV) may create a patterned area of dielectric layer 25a which may be a rectangle or a rectangular shaped area or a round TSV may use a round or round shaped area of dielectric layer 25a to cover TSV void 14. In an embodiment, the shape of the dielectric cover (i.e. dielectric layer 25a) may be any shape required to cover a void area of a topographical semiconductor feature which has a predictable void area.

Figure 3:
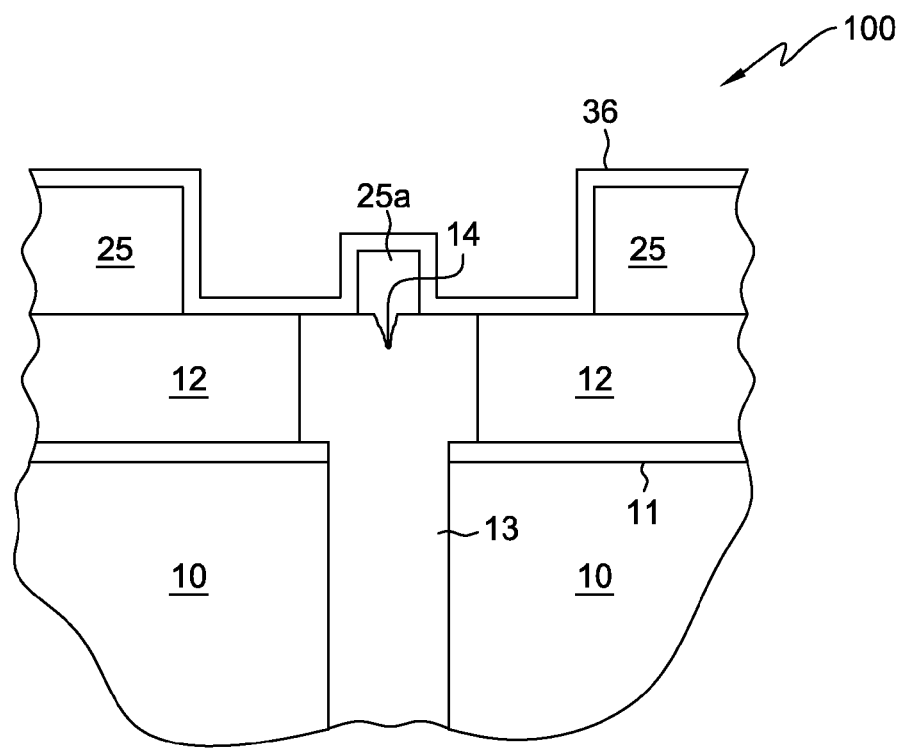
FIG. 3 depicts a cross-sectional view of the wafer after depositing a metal liner, in accordance with an embodiment of the present invention.

FIG. 3 depicts a cross-sectional view of wafer 100 after depositing a metal liner, in accordance with an embodiment of the present invention. FIG. 3 includes the elements of FIG. 2 and a layer 36 deposited over wafer 100. In the exemplary embodiment, layer 36 is a metal liner. Layer 36 may be a metal liner for a first metal (M1) interconnect layer in an interconnection layer such as in the BEOL interconnection and wiring layers. Layer 36 may include a liner deposited with conventional processes such as chemical vapor deposition (CVD) or other suitable deposition process. In the exemplary embodiment, the liner is composed of a TaN layer, then Ta layer followed by a copper seed layer, however, other metals may be used for the liner in another embodiment. In another embodiment, the liner may be composed of at least one of TaN, Ta, copper and one or more other metals or compound metal materials deposited in an appropriate order.

Figure 4:
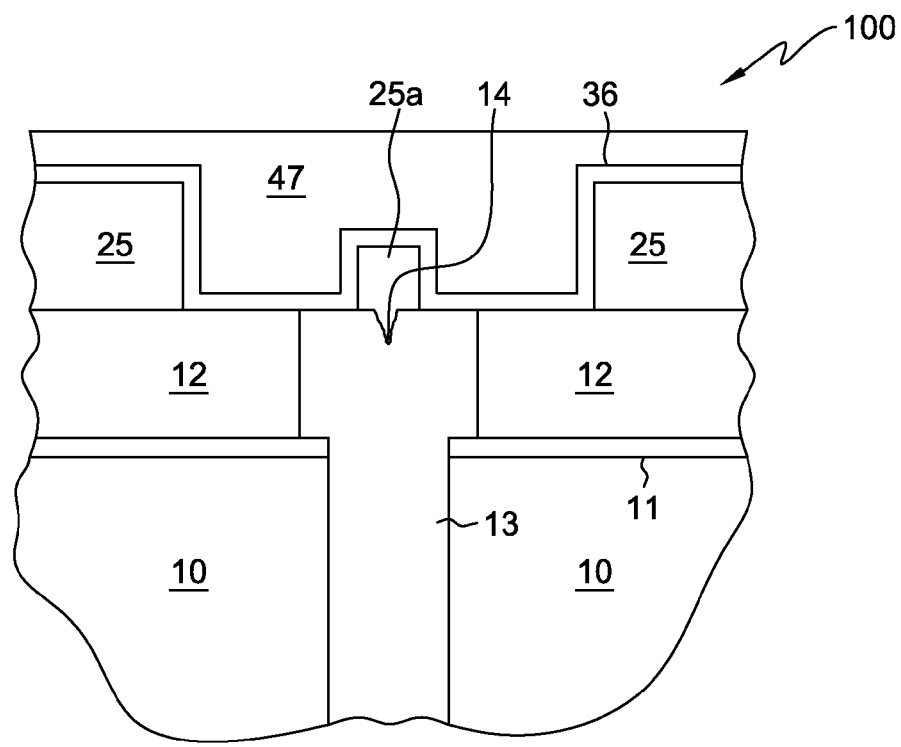
FIG. 4 depicts a cross-sectional view of the wafer after a first metal interconnection layer deposition, in accordance with an embodiment of the present invention.

FIG. 4 depicts a cross-sectional view of wafer 100 after M1 layer deposition, in accordance with an embodiment of the present invention. As depicted, FIG. 4 includes the elements of FIG. 3 and the first metal interconnect layer, M1 layer 47. In the exemplary embodiment, M1 layer 47 is copper which is deposited over layer 36, the M1 liner. The metal layer used the formation of M1 layer 47 may be composed of any suitable interconnection wiring metal or metal alloy, for example, aluminum or tungsten. In the exemplary embodiment, M1 layer 47 is deposited by conventional copper plating processes.

Figure 5A:
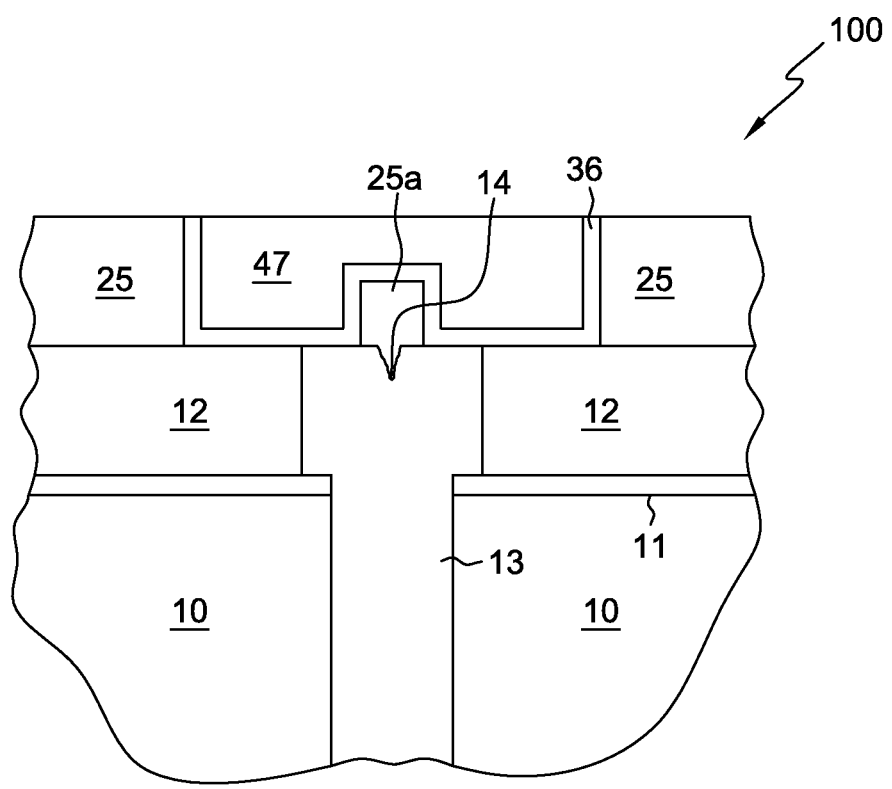
FIG. 5A depicts a cross-sectional view of the wafer after chemical mechanical polish, in accordance with an embodiment of the present invention.

FIG. 5A depicts a cross-sectional view of wafer 100 after chemical mechanical polish (CMP), in accordance with an embodiment of the present invention. In FIG. 5A, M1 layer 47 has been partially removed by a CMP. The CMP may be performed to remove a portion of layer 36 over dielectric layer 25 and stopping at the top surface of dielectric layer 25 to form a planar surface on wafer 100. The remaining portions of M1 layer 47 provide wiring, a connection or a surface for further BEOL wiring, connections, and dielectric layers. The remaining portions of M1 layer 47 adjacent to dielectric layer 25 reside over dielectric layer 25a, a portion of the TSV, and a portion of the first dielectric layer (i.e. layer 12). Dielectric layer 25a resides under a portion of M1 layer 47 remaining and prevents the ingress of plating solutions or other wet process solutions into TSV void 14 during processing.

Figure 5B:
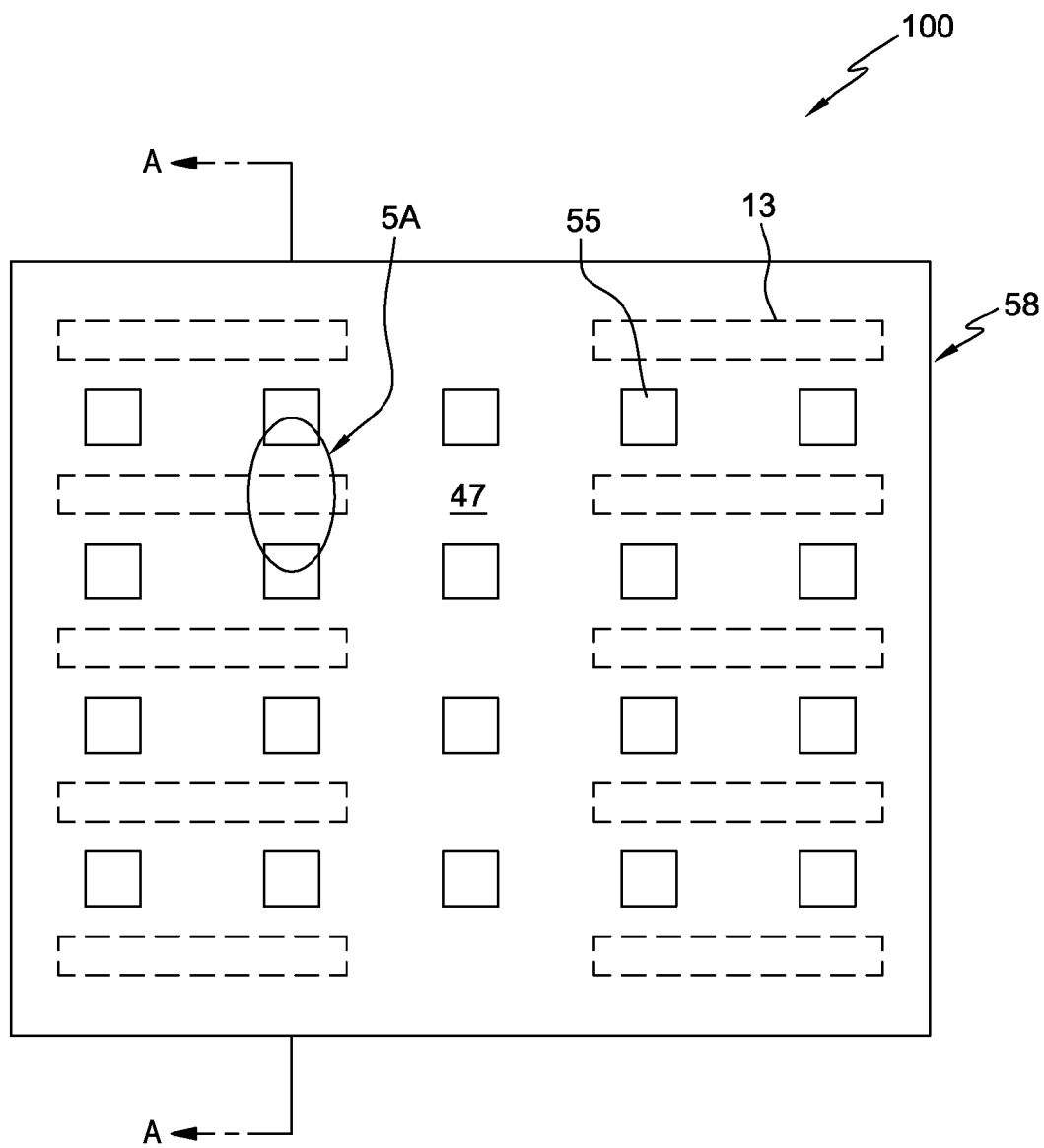
FIG. 5B depicts a top view of a metal pad on the wafer after chemical mechanical polish, in accordance with an embodiment of the present invention.

FIG. 5B depicts a top view of a metal pad 58 on wafer 100 after CMP, in accordance with an embodiment of the present invention. FIG. 5B depicts the top view of metal pad 58 connecting an array of individual TSV 13 and holes 55. In the exemplary embodiments, holes 55 are included in metal pad 58 to provide stress relief for metal pad 58. Metal pad 58 is composed of M1 layer 47, which is discussed with reference to FIG. 4. FIG. 5B also illustrates each of the TSV 13 vias locations for the array of TSV 13 under metal pad 58 indicated by dotted lines. An array of redundant TSV 13 may be used to provide better electrical performance, in addition, to providing enhanced reliability due to the redundancy of the TSV connections. Additionally, FIG. 5B indicates a location of a cross-sectional view A-A, which depicts the view shown in FIG. 5A (i.e. FIG. 5A includes the area of the oval on A-A).

In the exemplary embodiment, metal pad 58, composed of M1 layer 47, is a copper pad. Metal pad 58 may cover a portion of the semiconductor chip or wafer surface and multiple metal pad 58 may reside on a semiconductor chip or wafer. In other embodiments, metal pad 58 can be composed of another metal or metal alloy. In the exemplary embodiment, metal pad 58 is a square. In another embodiment, metal pad 58 is another geometric shape. For example, metal pad 58 may be a rectangle, a circle or another geometric shape. In addition, the number of TSV 13 connecting to metal pad 58 is not limited to the number of TSV 13 depicted but, may be any number of TSV 13 connecting to metal pad 58. For example, metal pad 58 may have twenty TSV 13 connecting to metal pad 58 instead of the ten TSV 13 connecting to metal pad 58 as depicted in FIG. 5B. While in most embodiments the array of TSV 13 connecting to metal pad 58 may have basically symmetric pattern or uniform repeating pattern, one embodiment may have non-uniform TSV 13 placement on metal pad 58.

In the exemplary embodiment, holes 55 in the metal pad 58 are filled with the second dielectric material, dielectric layer 25, which is SiO2. In another embodiment, holes 55 may be filled with another dielectric material. Holes 55 are depicted as squares in the exemplary embodiment. In another embodiment, holes 55 are any other geometric shape. For example, holes 55 may be a circle, a triangle, a bar, another geometric shape, or a combination of geometric shapes. In one embodiment, the holes may be an array of holes 55 in a repeating linear pattern in metal pad 58 which form an array of holes 55. Holes 55 in metal pad 58 may be placed in an approximately, uniform array in metal pad 58 around each TSV 13 (depicted by the dotted lines) to provide stress relief in the M1 metal layer 47 of metal pad 58. The location or the placement of holes 55 or a placement for each of the holes (i.e. holes 55)

may be determined by mechanical modelling of stress in M1 metal pads (i.e. metal pad 58), by empirical data gathered through process experimentation of stresses in M1 metal pads, or by designer determination of approximate uniform spacing of holes across metal pad 58 and around TSV 13.

In some embodiments, the semiconductor wafers formed by the embodiments of the present invention may be diced in semiconductor chip form. The resulting semiconductor chips can be distributed by the fabricator in raw wafer form (that is, as a single wafer that has multiple unpackaged chips), as a bare die or in a packaged form. In the latter case, the chip is mounted in a single chip package (such as a plastic carrier, with lead that is affixed to a motherboard or other higher level carrier) or in a multichip package (such as a ceramic carrier that has either or both surface interconnections or buried interconnections). In any case the chip is then integrated with other chips, discreet circuit elements, motherboard, or end product. The end product can be any product that includes integrated circuit chips, ranging from toys and other low-end applications to advanced computer products having a display, a keyboard, or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method for forming a dielectric layer over a void area of a topographical semiconductor feature, the method comprising:
    determining a location of a void area of the topographical semiconductor feature;
    depositing, on a first dielectric layer and a top surface of a topographical semiconductor feature, a second dielectric layer;
    patterning one or more portions of the second dielectric layer, wherein at least one portion of the patterned second dielectric layer is over the location of the void area of the topographical semiconductor feature;
    depositing a first metal layer over the second dielectric layer, at least one portion of the first dielectric layer, and a portion of the top surface of the topographical semiconductor feature; and
    performing a chemical mechanical polish of the first metal layer, wherein the chemical mechanical polish reaches the top surface of at least one of the one or more portions of the second dielectric layer.

2. The method of claim 1, wherein patterning the one or more portions of the second dielectric layer includes forming a first thickness for a first one of the one or more portions, and a second thickness for a second one of the one or more portions using at least one of a halftone mask process, a dual damascene process, and an etching process.

3. The method of claim 2, wherein the dielectric layer over the location of the void area is formed from the first one of the one or more portions of the second dielectric layer, wherein the first thickness is less than the second thickness.

4. The method of claim 1, further comprises forming the dielectric layer over the location of the void area on both ends of topographical semiconductor feature which is a TSV.

5. The method of claim 1, wherein the chemical mechanical polish of the first metal layer is performed to the top surface of the second one of the one or more portions, and wherein the second thickness is greater than the first thickness.

6. The method of claim 1, wherein the at least one portion of the patterned second dielectric layer over the void area of the topographical semiconductor feature which is a TSV is patterned to be one µm to four µm wide.

7. The method of claim 1, wherein the patterned second dielectric layer covering the void area of the topographical semiconductor feature forms a plug over a void in the topographical semiconductor feature.

8. The method of claim 1, wherein depositing the first metal layer over the second dielectric layer further comprises:
    depositing a metal liner layer; and
    depositing a metal material metal layer.

9. The method of claim 1, further comprises:
    forming from the first metal layer, a metal pad connecting an array of multiple topographical semiconductor features wherein the topographical semiconductor features are multiple TSV; and
    using the patterned second dielectric layer covering the least one portion of the first dielectric layer to form one or more holes of an array of holes in the metal pad.

10. The method of claim 9, further comprises determining a location for each of the one or more holes in the array of holes by one or more of the following: mechanical modelling of stress in the metal pad, empirical data gathered through process experimentation of stresses in the metal pad, or designer determination of approximate uniform spacing of each of the one or more holes in the array of holes in the metal pad.

11. The method of claim 9, wherein the one or more holes are filled with a dielectric material.

* * * * *